United States Patent
Stevens et al.

(10) Patent No.: US 8,610,498 B2
(45) Date of Patent: Dec. 17, 2013

(54) METHODS AND APPARATUS FOR VARIABLE SOLID STATE-TO-TUBE RECTIFICATION IN AN AMPLIFIER

(75) Inventors: Paul James Stevens, Chelmsford (GB); John Calvin Fields, Meridian, MS (US); Hartley D. Peavey, Meridian, MS (US)

(73) Assignee: Peavey Electronics Corporation, Meridian, MS (US)

( * ) Notice: Subject to any disclaimer, the term of this patent is extended or adjusted under 35 U.S.C. 154(b) by 985 days.

(21) Appl. No.: 12/686,047

(22) Filed: Jan. 12, 2010

(65) Prior Publication Data

US 2011/0170716 A1 Jul. 14, 2011

(51) Int. Cl.
*H03G 3/00* (2006.01)
*H03F 99/00* (2009.01)
*H02M 5/27* (2006.01)
*B23K 11/24* (2006.01)
*H02M 7/08* (2006.01)

(52) U.S. Cl.
USPC ............... 330/127; 381/120; 363/10; 363/11; 363/67

(58) Field of Classification Search
USPC ............ 381/120, 59, 96, 111; 330/128, 123, 330/202, 285, 297, 127; 363/10, 11, 67
See application file for complete search history.

(56) References Cited

U.S. PATENT DOCUMENTS 5,168,438 A * 12/1992 Smith .............................. 363/67
5,635,872 A 6/1997 Zimmerman
5,909,145 A * 6/1999 Zimmerman .................. 330/128
6,759,901 B2 * 7/2004 Fryette ........................... 330/127
7,193,458 B2 * 3/2007 Smith ............................ 330/118
7,417,502 B1 * 8/2008 Cochrane ...................... 330/127
7,602,927 B2 10/2009 Smith
2007/0178857 A1 8/2007 Greene et al.

OTHER PUBLICATIONS

International Search Report and Written Opinion for corresponding PCT Application No. PCT/US2011/020440, Mar. 11, 2011.
Premier Guitar "Details have emerged on Mesa/Boogie's new Dual and Triple rectifiers" http://www.premierguitar.com/Magazine/Issue/Daily/News/Mesa_Boogie_to_Introduce_New_Dual_Triple_Rectifiers_in_2010.aspx.

* cited by examiner

*Primary Examiner* — Mohammad Islam
*Assistant Examiner* — David Ton
(74) *Attorney, Agent, or Firm* — Matthew B. Dernier, Esq.; Gibson & Dernier LLP

(57) ABSTRACT

Methods and apparatus provide for: a rectification circuit operating to convert a source of AC power into a final DC power source; a rectification filtering capacitance operating to at least partially smooth a voltage of the final DC power source, which exhibits a voltage sag and recovery characteristic in response to time-variant current drawn therefrom; a power amplification circuit drawing power from the final DC power source and producing an output signal, for driving a speaker, having audible characteristics influenced by the voltage sag and recovery characteristic of the final DC power source; and a control circuit operating to continuously vary, in response to user input, one or more parameters of the voltage sag and/or recovery characteristic of the final DC power source.

19 Claims, 7 Drawing Sheets

METHODS AND APPARATUS FOR VARIABLE SOLID STATE-TO-TUBE RECTIFICATION IN AN AMPLIFIER

BACKGROUND OF THE INVENTION

The present invention relates to methods and apparatus for selectively changing a proportion of power provided by a solid state rectification circuit as compared with power provided by a vacuum tube rectification circuit, and delivering such power to an amplifier.

Designers of guitar amplifiers, up until the late 1950's, focused on creating inexpensive amplifiers with very little distortion. This was not an easy task as solid state devices were not generally available and nearly all amplifiers were designed and built using vacuum tubes. Although tube amplifiers inherently have more distortion than solid state amplifiers, the early amplifier designers tried to produce amplifiers with little or no distortion. Most of their designs had a high order of distortion, especially second harmonic distortion, because most used Class A power amplifier topologies.

In the context of electric guitar amplification, the existence of harmonic distortion in the amplifier is not undesirable. Indeed, it has been generally thought that even order harmonics are pleasing to the ear, (especially the second harmonic), while odd order harmonics are thought to sound unpleasant to some people, especially the third and fifth harmonics. The desirability of even order harmonics appears to hold even in fairly high ratios to the normal (undistorted) signal.

As most rock guitar players use solid body guitars, which provide relatively little resonance, most of the harmonics associated with the characteristic sounds identifiable as an electric guitar actually come from the amplifier and not the guitar. The harmonics introduced by the guitar amplifier differentiate one guitar system (e.g., guitar and amplifier combination) from another, thereby giving each system some individuality. Thus, guitar amplification has become a niche technology within the broader universe of the audio amplification arts. What sets a guitar amplifier apart from an amplifier found in, for example, a sound system or a home stereo is that the latter tends to reproduce sounds as closely as possible to the input signal, while the former significantly alters the sound and is, in essence, an extension of the instrument and a part of an overall guitar system.

Guitar amplifiers are typically designed with excess gain, allowing the guitar, when played hard, to generate a signal that is sufficient to overdrive one or more tube stages and thus generate deliberate gross distortion. The characteristics of the tube and the circuit design directly influence the tone that results.

It is noted that even the power supply can influence the tone of the system. For example, in many amplifier circuits, a high voltage AC source (such as from a mains transformer) is rectified using one or more tube rectifiers and smoothed using one or more rectification capacitors. The high level DC voltage from the rectification capacitors is used (among other places) to supply the plate(s) and/or screen(s) of the power output tube(s). When the rectification capacitors are undersized, in terms of their ability to hold up the rectified voltage during surges of output power from through the power output tubes, the high level DC voltage exhibits a characteristic "sag" and subsequent recovery. The magnitude of the voltage sag and recovery time of the sag characteristic may be considered musically engaging to many people.

Unfortunately, conventional amplifier circuits do not provide the user with a means to control or manipulate the characteristics of the B+ voltage sag and/or recovery in any smooth or continuous fashion.

SUMMARY OF THE INVENTION

In accordance to one or more aspects of the present invention, methods and apparatus provide: a rectification circuit operating to convert a source of AC power into a final DC power source; a rectification filtering capacitance operating to at least partially smooth a voltage of the final DC power source, which exhibits a voltage sag and recovery characteristic in response to time-variant current drawn therefrom; a power amplification circuit drawing power from the final DC power source and producing an output signal, for driving a speaker, having audible characteristics influenced by the voltage sag and recovery characteristic of the final DC power source; and a control circuit operating to vary, in response to user input, one or more parameters of the voltage sag and/or recovery characteristic of the final DC power source. The one or more parameters of the voltage sag and/or recovery characteristic of the final DC power source are preferably continuously variable between one extreme and another, not simply two or three discrete points.

Other aspects, features, and advantages of the present invention will be apparent to one skilled in the art from the description herein taken in conjunction with the accompanying drawings.

DESCRIPTION OF THE DRAWINGS

For the purposes of illustration, there are forms shown in the drawings that are presently preferred, it being understood, however, that the invention is not limited to the precise arrangements and instrumentalities shown.

DETAILED DESCRIPTION OF THE PREFERRED EMBODIMENTS

Figure 1:
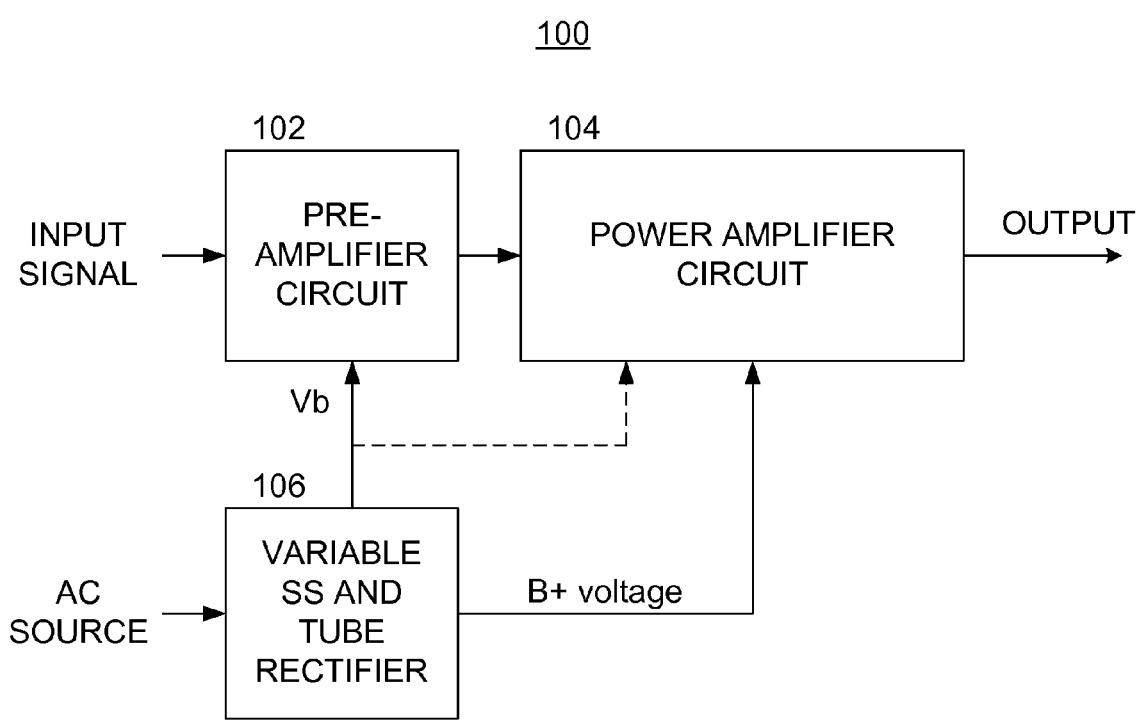
FIG. 1 is a block diagram of an amplifier circuit that is operable to provide a user with the ability to adjust the dynamic characteristics of an audio output signal.

With reference to the drawings, wherein like numerals indicate like elements, there is shown in FIG. 1 a block diagram of an amplifier circuit 100 that is operable to provide a user with influence on the quality of the audible characteristics of an audio output signal, particularly the dynamic characteristics resulting from the voltage sag and recovery characteristic of a power supply of the system. Such dynamic characteristics include a power compression characteristic. The amplifier circuit 100 includes a pre-amplifier circuit 102, a power amplifier circuit 104, and a variable solid-state and vacuum tube rectifier circuit (rectification circuit) 106.

The pre-amplifier circuit 102 is preferably operable to receive an input signal (such as from upstream circuitry of the amplifier, such as from an electric guitar) and to produce one or more low power level drive signals to the power amplifier circuit 104. The power amplifier circuit 104 includes one or more active elements to amplify the low power level drive signal of the pre-amplifier circuit 102 and produce a high power level signal, suitable for driving a transformer output stage and an audio loud speaker. Further details regarding the interoperability of the rectification circuit 106 and the pre-amplifier circuit 102 and/or power amplifier circuit 104, as well as possible implementations thereof, will be provided later in this description.

In accordance with one or more aspects of the present invention, the rectification circuit 106 is preferably operable to convert a source of AC power (AC SOURCE) into a final DC power source, B+. The influence that the user has on the dynamic characteristics of the audio output signal (OUTPUT) from the power amplifier circuit 104 is preferably achieved by varying one or more parameters of the rectification circuit 106. As will be described in further detail below, such variations in the rectification circuit 106 may change the voltage sag and/or recovery characteristic of the voltage supplied by the final DC power source, B+.

Figure 2:
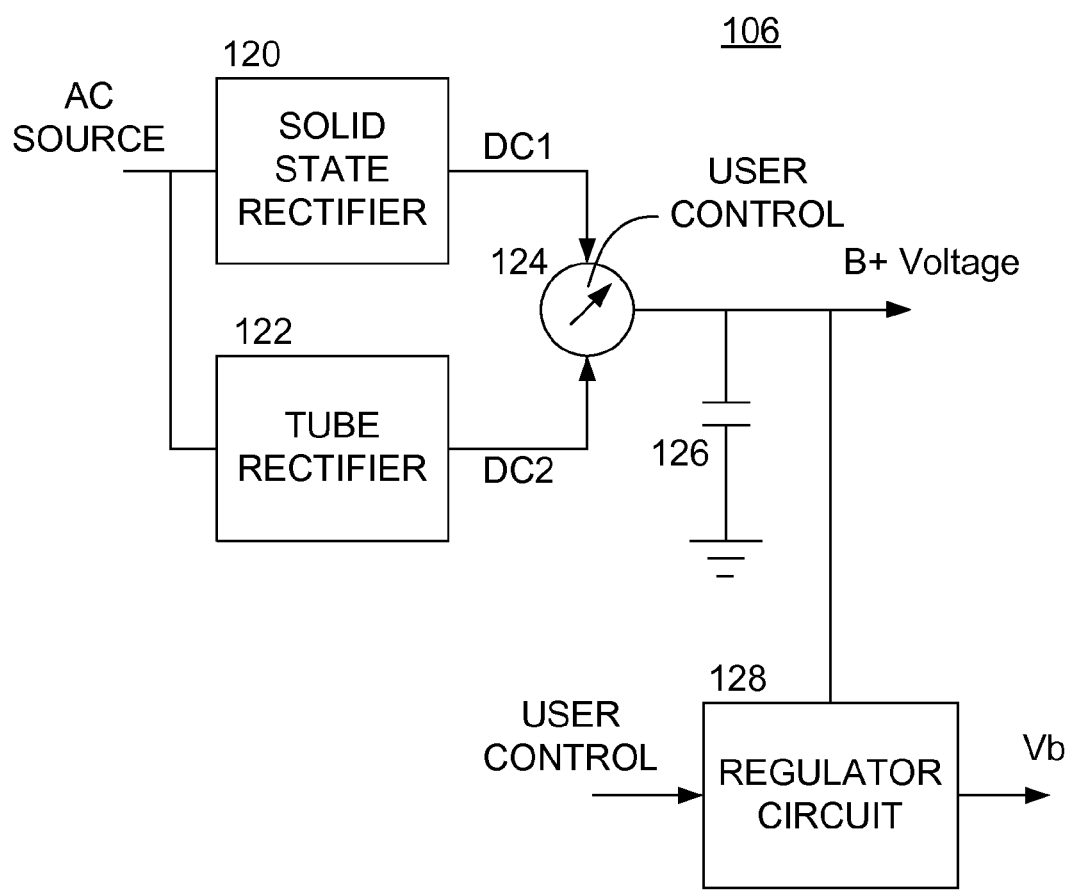
FIG. 2 is a block diagram of a variable solid-state and vacuum tube rectifier circuit that is suitable for use in the amplifier circuit of FIG. 1, and/or other embodiments.

In this regard, reference is now made to FIG. 2, which is a block diagram of an implementation of the variable solid-state and vacuum tube rectifier circuit 106 that is suitable for use in the amplifier circuit 100 of FIG. 1, and/or other embodiments. The rectification circuit 106 may include a solid state rectifier circuit 120, a vacuum tube rectifier circuit 122, a combiner circuit 124, and a rectification filtering capacitance 126. The solid state rectifier circuit 120 is operable to convert the source of AC power into a first DC power source (DC1) using one or more solid state rectification devices. The vacuum tube rectifier circuit 122 is also operable to convert the source of AC power into DC power, specifically a second DC power source (DC2) using one or more vacuum tube rectification devices. The combiner circuit 124 is operable to merge the first and second DC power sources DC1, DC2 to produce the final DC power source, B+, which is taken across the filtering capacitance 126.

The rectification filtering capacitance 126 is operable to at least partially smooth the voltage of the final DC power source B+, and exhibits a voltage sag and recovery characteristic in response to time-variant current drawn therefrom. In particular, the power amplification circuit 104 may draw time-variant power from the final DC power source, B+, when producing the output signal (OUTPUT) to the loud speaker. Since such time-variations are load transients (surges of current) with respect to the filtering capacitance 126, the DC voltage across the filtering capacitance 126 may sag and recover in response. As mentioned above, the audible characteristics of the audio output signal (OUTPUT) may be influenced by the supply voltage sag and/or recovery characteristic of the B+ voltage across the filtering capacitance 126.

The particularities of the voltage sag and/or recovery characteristic of the final DC power source, B+, may themselves be influenced by a number of parameters of the system. For purposes of a general discussion of the system 100, a control circuit (schematically illustrated by the arrow on the combiner circuit 124) is preferably employed, which is operable to vary, in response to user input, one or more parameters of the voltage sag and/or recovery characteristic of the final DC power source, B+. It is noted that the preferred mode of providing the user-induced variation includes continuous variation, not simply a selection between only two or three discrete points. In accordance with one aspect of the invention, the control circuit operates, in response to the user input, to variably selectively (e.g., continuously) change a proportion of the first DC power DC1 provided by the solid state rectifier circuit 120 as compared with the second DC power DC2 provided by the vacuum tube rectifier circuit 122, that are merged by the combiner circuit 124 to produce the final DC power source across filtering capacitance 126. In this regard, the user's influence on the voltage sag and/or recovery characteristic of the final DC power source, B+, is based on one or more of: the total capacitance of filtering capacitance 126, the load transient characteristics of the solid state rectifier circuit 120, and the load transient characteristics of the vacuum tube rectifier circuit 122.

Indeed, assuming that, in this embodiment, the total capacitance of filtering capacitance 126 is fixed, then influence on the supply voltage sag and/or recovery characteristic of the final DC power source, B+, may be achieved by adjusting the relative influence of the load transient characteristics of the solid state rectifier circuit 120 as compared with that of the vacuum tube rectifier circuit 122. In this regard, the respective load transient characteristics of the rectifier circuits 120, 122 may be deliberately different. For example, the load transient characteristics of the solid state rectifier circuit 120 may be "stiffer" (e.g., the voltage sag may be lower) as compared with that of the vacuum tube rectifier circuit 122. Therefore, adjusting the relative proportions of the first DC power DC1 as compared with the second DC power DC2 through the combiner circuit 124 results in changing the load transient response of the final DC power source, B+, across the filtering capacitance 126. Which is to say that the user may adjust one or more parameters of the voltage sag and/or recovery characteristic of the final DC power source, B+.

Figure 3:
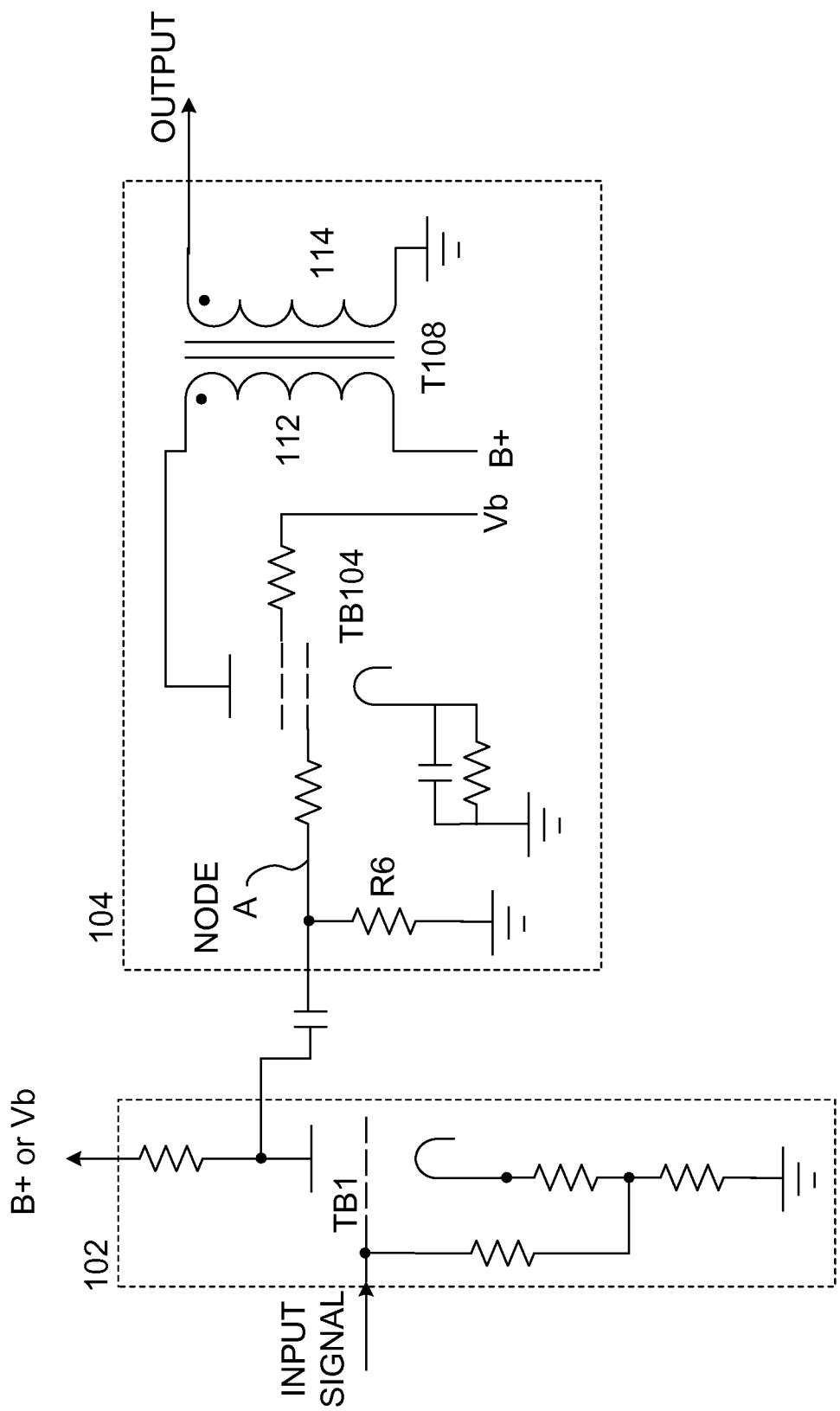
FIG. 3 is a schematic diagram of one embodiment of a combined pre-amplifier and class-A power amplifier circuit that may be employed in the amplifier circuit of FIG. 1, and/or other embodiments.

Reference is now made to FIG. 3, which is a schematic diagram of one embodiment of a combined pre-amplifier circuit 102 and Class-A power amplifier circuit 104 that may be employed in the amplifier 100 of FIG. 1, and/or other embodiments. The aforementioned rectification circuit 106 (although not shown in FIG. 3) is coupled to the power amplifier circuit 104 at node B+. The pre-amplifier circuit 102 includes an active element (in this case a vacuum tube TB1) that is in a voltage follower configuration. The pre-amplifier circuit 102 is operable to produce a single-ended drive signal on node A (in response to the input signal) in order to drive the input of the power amplifier circuit 104.

The power amplifier circuit 104 includes a vacuum tube TB104, which is in a single-ended drive configuration with an output transformer 108. The tube TB104 may be self biased. The input signal on node A is coupled to the grid of the tube TB104 and controls a relatively high-power signal driving current through the primary winding 112 of the transformer T108. The plate of the tube TB104 is coupled to the final DC power source, B+, through the primary winding 112 of the transformer T108. Thus, the user-controllable voltage sag and/or recovery characteristic of the final DC power source, B+, may influence the audio characteristics of the drive signal to the primary winding 112 of the transformer T108, and therefore also influence the dynamic audio characteristics of the output signal from the secondary winding 114 of the transformer T108.

It is noted that advantages of the invention may be obtained when the pre-amplifier 102 and/or the power amplifier 104 are implemented utilizing one or more vacuum tubes. It is contemplated, however, that other types of devices may be employed, such as field effect transistors, bipolar transistors, etc.

In accordance with one or more further aspects of the invention, there is another way that the user may influence the audio characteristics of the drive signal to the primary winding 112 of the transformer T108, and therefore also influence the audio characteristics of the output signal from the secondary winding 114 of the transformer T108. In particular, the user may control at least some of the characteristics (especially the transient, dynamic characteristics) of the DC voltage to the screen of tube TB104, which is labeled Vb in FIG. 3. While conventional circuit design may call for connecting the screen of tube TB104 through some resistance to, for example, the same DC power supply that the plate is connected to, such screen voltage may instead be affected by a voltage regulator circuit 128 (see FIG. 2).

The voltage regulator circuit 128 may, for example, be implemented via solid state active components, and may be coupled between the final DC power source, B+, and the secondary DC power source, Vb. Although not shown in FIG. 2, the voltage regulator circuit 128 may include a rectification filtering capacitance operating to at least partially smooth a voltage of the secondary DC power source, Vb. The secondary DC power source, Vb, may also exhibit its own voltage sag and/or recovery characteristic in response to time-variant current drawn therefrom. In general, the voltage regulator circuit 128 may modify the characteristic of the final DC power source through voltage regulation. (An example of a circuit implementation for the voltage regulator circuit 128 will be described later herein.) The voltage regulator circuit 128 operates, in response to user input, to adjust one or more parameters of the voltage sag and/or recovery characteristic of Vb, and therefore of the screen terminal of the tube TB104.

In accordance with one or more still further aspects of the invention, there is yet another way that the user may influence the audio characteristics of the output from the power amplifier circuit 104. For example, the user may influence the characteristics of the DC voltage on the plate of the tube TB1 of the pre-amplifier circuit 102, which in-turn, affects the drive signal on node A to the power amplifier circuit 104. In this regard, the plate of the tube TB1 may be connected to either the B+, or preferably the Vb DC power source. While conventional circuit design may call for connecting the plate of the tube TB1 through some resistance to, for example, the same DC power supply that the plate of TB104 is connected to, such plate voltage may instead be affected by the voltage regulator circuit 128. Thus, the user may further affect the audio characteristics of the drive signal to the primary winding 112 of the transformer T108, and therefore further influence the audio characteristics of the output signal from the secondary winding 114 of the transformer T108.

In accordance with one or more embodiments, the control circuit and the voltage regulator circuit 128 are electrically and/or mechanically coupled to one another such that the same user input simultaneously effects: (i) the one or more parameters of the voltage sag and/or recovery characteristic of the final DC power source, B+; and (ii) the one or more parameters of the voltage sag and/or recovery characteristic of the secondary DC power source, Vb. Thus, the user may simultaneously affect the transient characteristics of the DC voltages of the plate and screen of tube TB104, and the plate of the tube TB1. Depending on the specific circuit implementations employed, the user may be provided with variation between two audio extremes. One extreme being where: (i) B+ on the plate of tube TB104 exhibits significant sag (where the vacuum tube rectifier circuit 122 is providing most if not all the power to B+), and (ii) Vb on the screen of the tube TB104 (and/or the plate of TB1) also exhibits significant sag (where the voltage regulator circuit 128 provides minimal or no further stiffening to the voltage characteristics of Vb). And the other extreme being where: (i) B+ on the plate of tube TB104 exhibits minimum sag (where the solid state rectifier circuit 120 is providing most if not all the power to B+), and (ii) Vb on the screen of the tube TB104 (and/or the plate of TB1) also exhibits minimal sag (where the voltage regulator circuit 128 provides significant stiffening to the voltage characteristics of Vb).

Figure 4:
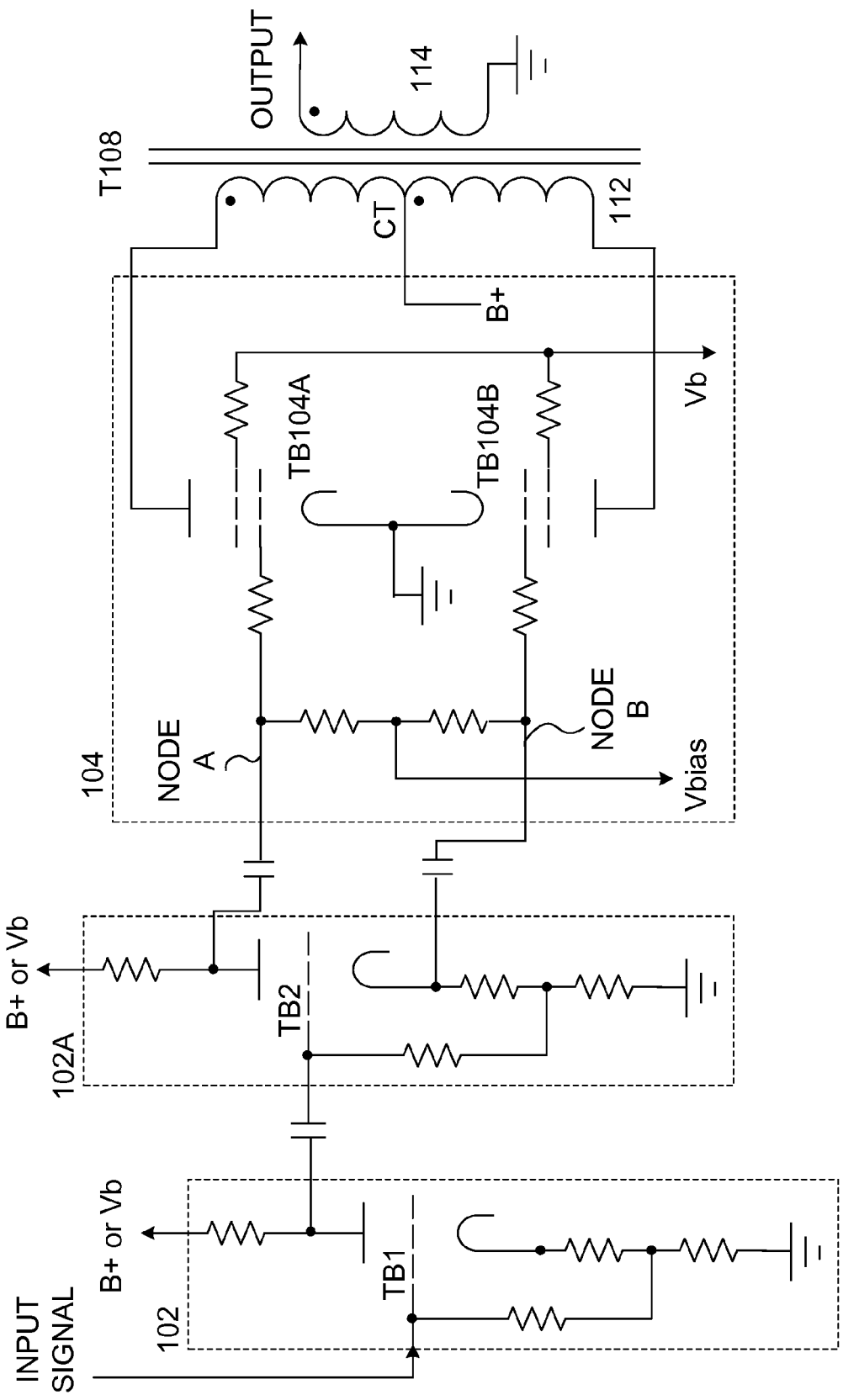
FIG. 4 is a schematic diagram of one embodiment of a combined pre-amplifier and class-A/B power amplifier circuit that may be employed in the amplifier circuit of FIG. 1, and/or other embodiments.

Reference is now made to FIG. 4, which is a schematic diagram of an alternative embodiment of a combined pre-amplifier circuit 102 and Class-A/B power amplifier circuit 104 that may be employed in the amplifier 100 of FIG. 1, and/or other embodiments. The aforementioned rectification circuit 106 (although not shown in FIG. 4) is coupled to the power amplifier circuit 104 at nodes B+ and/or Vb.

The pre-amplifier circuit 102 of FIG. 4 operates as in the embodiment of FIG. 3, except that it drives a phase inverter circuit 102A. The phase inverter circuit converts the single ended signal from the pre-amplifier circuit 102 into an out-of-phase signal on node A and an in-phase signal on node B, which drive the Class A/B power amplifier circuit 104.

The class A/B power amplifier circuit 104 includes a pair of vacuum tubes TB104A, TB104B, which are in a push-pull drive configuration with the output transformer 108. In particular, the transformer T108 includes a center-tapped primary winding 112 and a secondary winding 114. The tubes TB104A, TB104B each have at least a pair of power terminals (plate and cathode), and at least one control terminal (one or more grids). The cathodes of each tube TB104A, TB104B are coupled to a common node, such as ground. The respective grids of the tubes TB104A, TB104B are biased at a potential below the respective cathodes by way of a negative bias voltage and bias resistors. The grids of the tubes TB104A, TB104B receive the drive signals on node A and node B, respectively.

The outer terminals of the primary winding 112 are coupled in series with the tubes TB104A, TB104B, which are also in series. In particular, the plate terminal of the tube TB104A is coupled to the first end of the primary winding 112, the plate terminal of the other tube TB104B is coupled to the second end of the primary winding 112. The center tap of the primary winding 112 is coupled to the final DC power source, B+. Thus, as in other embodiments, the user-controllable voltage sag and/or recovery characteristic of the final DC power source, B+, may influence the audio characteristics of the drive signals to the primary winding 112 of the transformer T108, and therefore also influence the audio characteristics of the output signal from the secondary winding 114 of the transformer T108.

If not connected in a conventional manner, the screens of the tubes TB104A, TB104B may be biased by way of the secondary DC power source, Vb. Thus, the user may adjust one or more parameters of the voltage sag and/or recovery characteristic of Vb, and therefore of the screen terminals of the tubes TB104A, TB104B via the voltage regulator circuit 128.

Alternatively or additionally, the user may also influence the characteristics of the DC voltage on the plate of the tube TB1 of the pre-amplifier circuit 102, and/or the DC voltage on the plate of the tube TB2 of the phase inverter circuit 102A. Either or both of these plate voltages affect the drive signals on nodes A and B to the power amplifier circuit 104. In this regard, the plates of the tube TB1 and/or the tube TB2 may be connected to either the B+, or preferably the Vb DC power source. Thus, the user may further affect the audio characteristics of the drive signals to the primary winding 112 of the transformer T108, and therefore further influence the audio characteristics of the output signal from the secondary winding 114 of the transformer T108.

Figure 5:
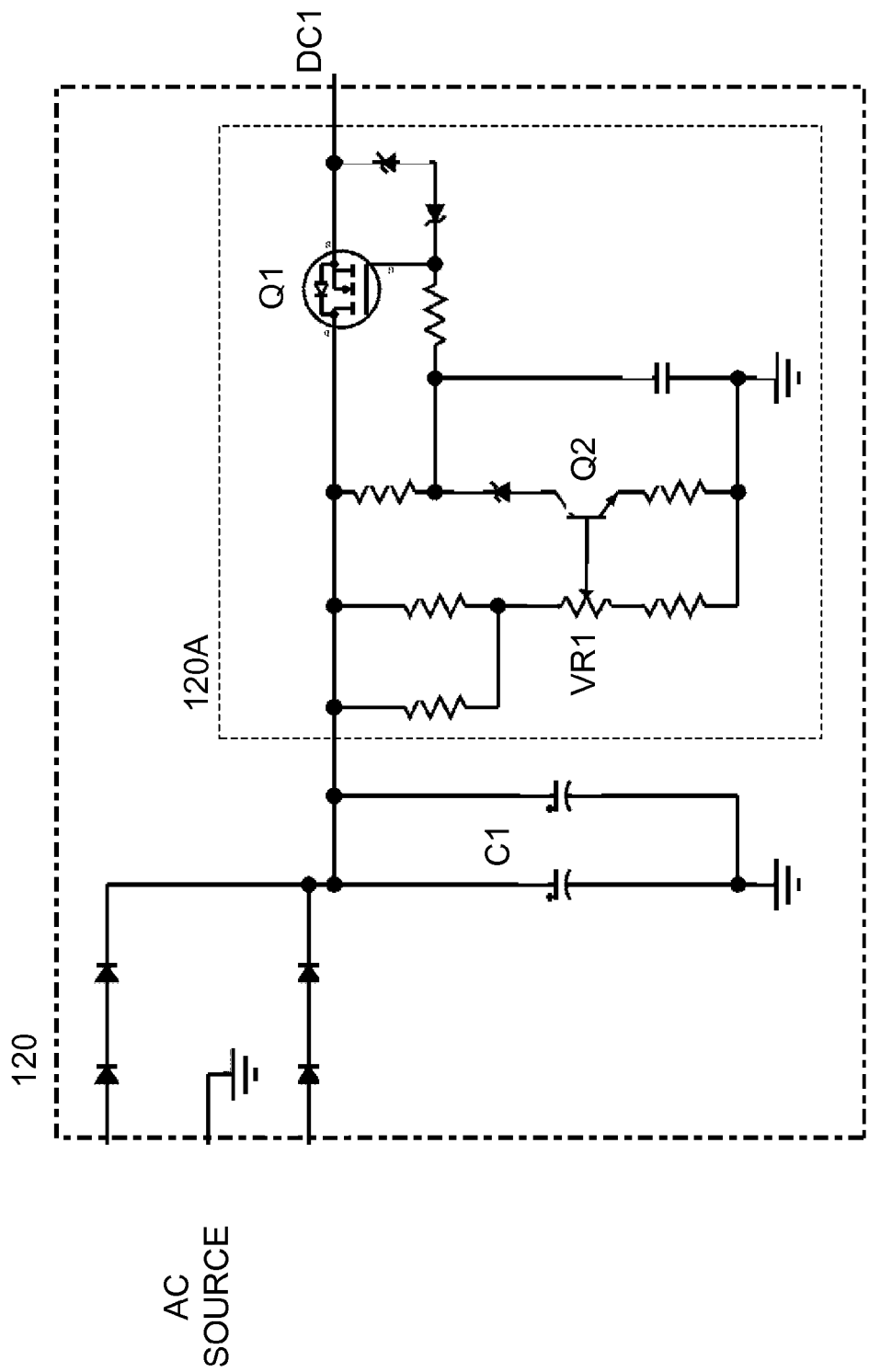
FIG. 5 is a detailed schematic diagram of one embodiment of a solid state rectifier circuit (including a voltage regulator) that may be employed in the amplifier circuit of FIG. 2, and/or other embodiments.
Figure 6:
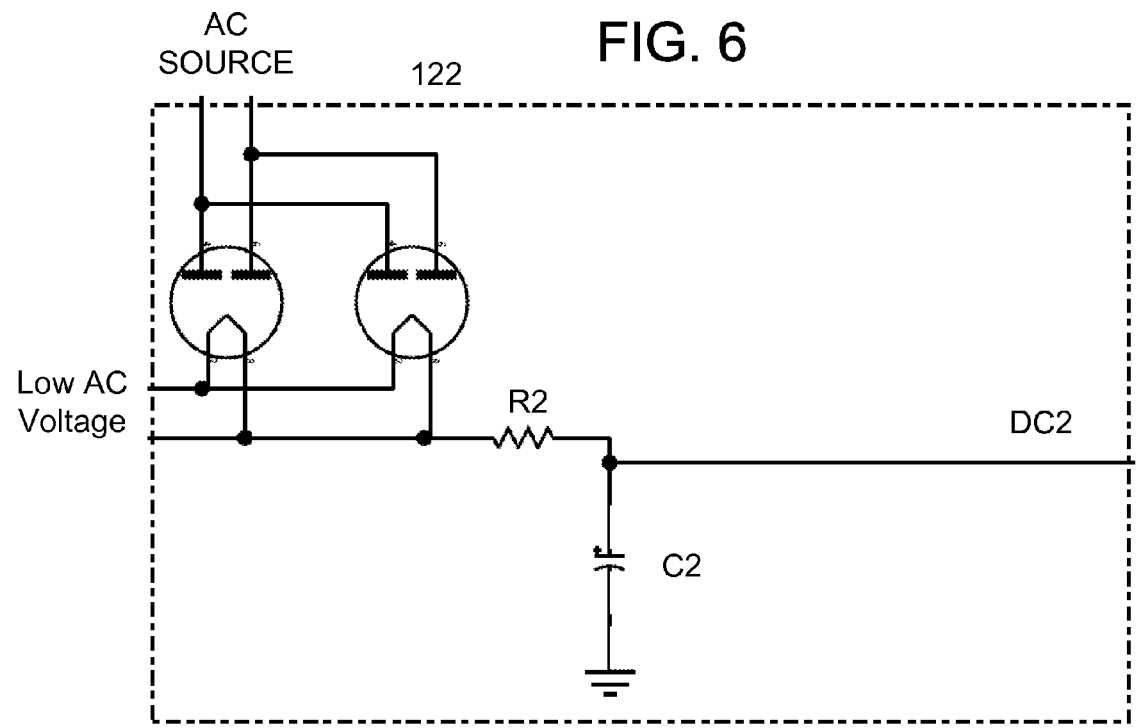
FIG. 6 is a detailed schematic diagram of one embodiment of a vacuum tube rectifier circuit that may be employed in the amplifier circuit of FIG. 2, and/or other embodiments.
Figure 7:
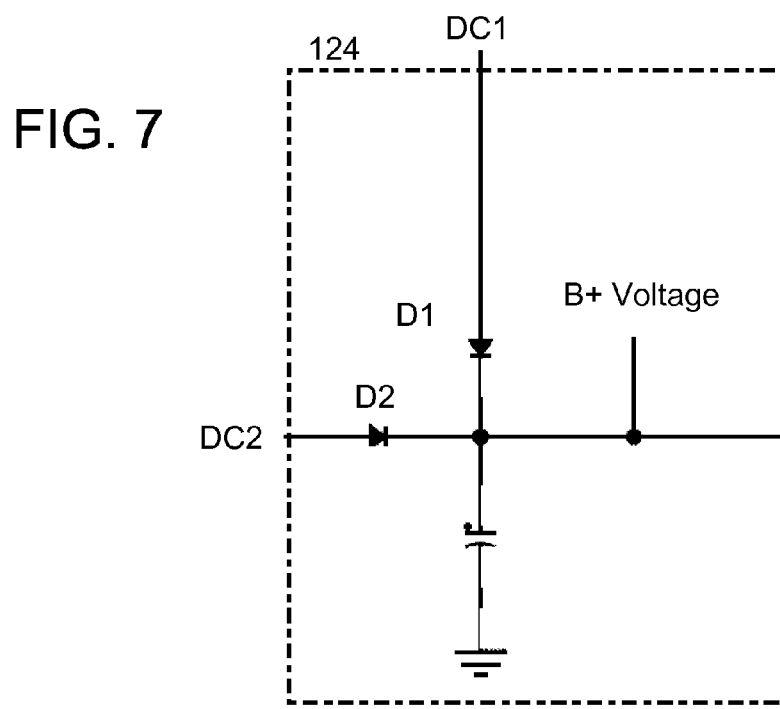
FIG. 7 is a detailed schematic diagram of one embodiment of a combiner circuit that may be employed in the amplifier circuit of FIG. 2, and/or other embodiments.

FIG. 5 is a detailed schematic diagram of one embodiment of a solid state rectifier circuit 120, and FIG. 6 is a detailed schematic diagram of one embodiment of a vacuum tube rectifier circuit 122, which may be employed in the amplifier circuit of FIG. 2, and/or other embodiments. FIG. 7 is a detailed schematic diagram of one embodiment of a combiner circuit 124 that may be employed to merge the first and second DC power sources DC1, DC2. For the purposes of brevity, a detailed analysis and discussion of all of the circuit components, interconnections, and operations of each circuit 120, 122 will not be provided here, as such will be apparent to those skilled in the art given the description provided herein.

Notably, however, the solid state rectifier circuit 120, and the vacuum tube rectifier circuit 122 have respective first and second filtering capacitance networks C1, C2. The first filtering capacitance network C1 operates to at least partially smooth a voltage of the first DC power source DC1, while the second capacitance network C2 operates to at least partially smooth a voltage of the second DC power source DC2.

The total capacitance of C1 may be different than C2 in order to achieve the aforementioned differences in transient load characteristics of the first and second DC power sources DC1, DC2 (and thus the adjustability in the voltage sag and/or recovery characteristic of the final DC power source B+). For example, the total capacitance of the first capacitance C1 may be substantially greater than the total capacitance of the second capacitance C2 (i.e., the first DC power source DC1 may be stiffer than the second DC power source DC2). Consequently, a magnitude of voltage sag and/or recovery of the first DC power source DC1 may be substantially lower than a magnitude of voltage sag and/or recovery time of the second DC power source DC2. The second capacitance network C2 may include an impedance R2 coupled between the one or more vacuum tube rectification devices V1, V2 and the second capacitance network C2. The impedance R2 tends to increase the magnitude of voltage sag, and/or increase the voltage recovery time, of the second DC power source DC2.

At least one of the solid state rectifier circuit 120 and the vacuum tube rectifier circuit 122 includes the control circuit for varying, in response to the user input, the one or more parameters of the voltage sag and/or recovery characteristic of the final DC power source, B+. For example, the control circuit 120A may be disposed within the solid state rectifier circuit 120 (FIG. 5). The control circuit 120A may include a variable voltage regulator coupled between the first DC power source DC1 and the combiner circuit 124. In this embodiment, a metal-oxide field effect transistor (MOSFET) Q1 is employed as a pass element between the first filter capacitance C1 and the first DC power source DC1. The MOSFET Q1 is controlled via a gate drive circuit, including a potentiometer VR1 (which the user may actuate) and a drive transistor Q2, which set up as a DC voltage amplifier. The potentiometer VR1 is connected to the rectified high voltage across C1 so that the output of the wiper tracks with the incoming mains voltage fluctuations. The resistor network around VR1 set maximum and minimum settings of VR1. The connection of VR1 may be inverted (as compared to conventional regulators) so that clockwise rotation causes the voltage on the wiper to reduce. The wiper voltage is fed into the base of Q2 such that as VR1 is turned clockwise, the voltage to the gate of Q1 increases from some minimum to some maximum (such as about 382V to 482V for a 350 VAC input). The gate voltage controls the output at the source of Q1 between approximately 380V and 480V (in this example) on DC1.

The combiner circuit 124 may be operable to output voltage and current from whichever of the first and second DC power sources DC1, DC2 has a higher magnitude voltage to produce the final DC power source, B+. For example, the combiner circuit 124 may include a first diode circuit D1 coupled between the first DC power source DC1 and the final DC power source B+, and a second diode circuit D2 coupled between the second DC power source DC2 and the final DC power source, B+.

When VR1 is set all the way clockwise (which may be considered one of a minimum and maximum electrical property, in this case ohms), the voltage on DC1 will be at a maximum, approximately 480V (in keeping with the example above). Thus, DC1 would be well above DC2, and therefore DC1 will supply most if not all the current through the combiner circuit 124 to the final DC power source B+. As VR1 is turned all the way counterclockwise (the other of the minimum and maximum electrical property), the voltage on DC1 will drop below DC2, at which point DC2 will supply most if not all the current through the combiner circuit 124 to the final DC power source B+. At positions between the minimum and maximum of VR1, the percentage (or proportion) of the current drawn from DC1 as compared with DC2 will vary and affect the amount of sag and/or recovery time of B+.

Figure 8:
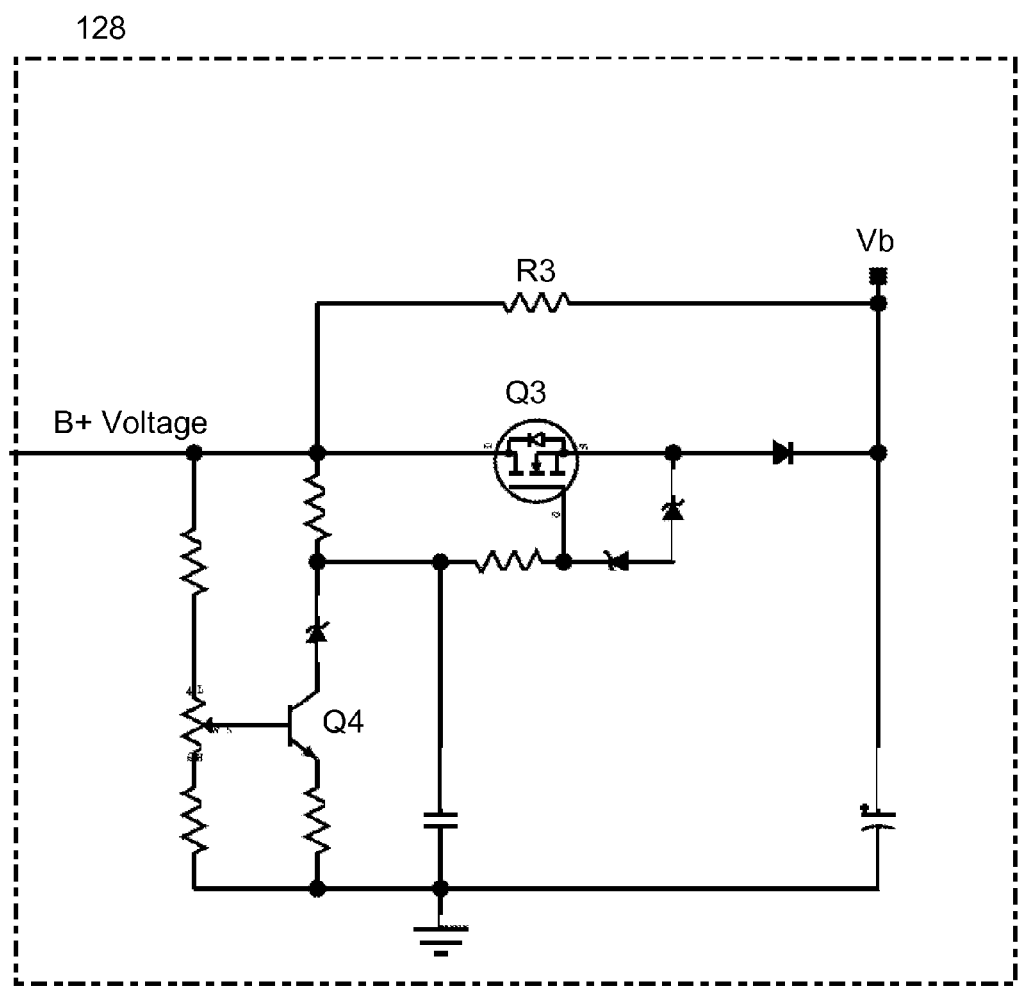
FIG. 8 is a detailed schematic diagram of one embodiment of a variable regulator circuit that may be employed in the amplifier circuit of FIG. 2, and/or other embodiments.

FIG. 8 is a detailed schematic diagram of one embodiment of the variable regulator circuit 128 that may be employed in the amplifier circuit 100 of FIG. 2, and/or other embodiments. The variable voltage regulator circuit 128 is coupled between the final DC power source B+ and the secondary DC power source Vb. In this embodiment, a MOSFET Q3 is employed as a pass element between the B+ and Vb, and the output is taken across a smoothing capacitor. The MOSFET Q3 is controlled via a gate drive circuit, including a potentiometer VR2 (which the user may actuate) and a drive transistor Q4. The potentiometer VR2 is coupled to B+ and the wiper voltage is fed into the base of Q4, such that as VR2 is turned clockwise, the voltage to the gate of Q3 increases from some minimum to some maximum, which also controls Vb.

Vb also derives some of its current through a resistor R3. Thus, as VR2 is turned one way or the other, the load transient response of Vb (e.g., the voltage sag and/or recovery) will vary. As discussed above, the user may be provided with two separate controls, one for VR1 and one for VR2, in order to provide separate inputs for varying the characteristics of B+ and Vb. Alternatively, VR1 and VR2 may be ganged (or otherwise coupled to one another) in order to provide the user with one input which simultaneously varies the characteristics of B+ and Vb.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An apparatus, comprising:
   a rectification circuit operating to convert a source of AC power into a final DC power source, the rectification circuit including: (i) a solid state rectifier circuit operating to convert the source of AC power into a first DC power source using one or more solid state rectification devices, and (ii) a vacuum tube rectifier circuit operating to convert the source of AC power into a second DC power source using one or more vacuum tube rectification devices;
   a combiner circuit operating to merge the first and second DC power sources to produce the final DC power source;
   a rectification filtering capacitance operating to at least partially smooth a voltage of the final DC power source, which exhibits a voltage sag and recovery characteristic in response to time-variant current drawn therefrom;
   a power amplification circuit drawing power from the final DC power source and producing an output signal, for driving a speaker, having audible characteristics influenced by the voltage sag and recovery characteristic of the final DC power source; and
   a control circuit operating, in response to user input, to selectively change a proportion of the first DC power provided by the solid state rectifier circuit as compared with a proportion of the second DC power provided by the vacuum tube rectifier circuit, that are merged by the combiner circuit to control one or more parameters of the voltage sag and recovery characteristic of the final DC power source.

2. The apparatus of claim 1, wherein the rectification filtering capacitance includes at least one of:
   a first capacitance network operating to at least partially smooth a voltage of the first DC power source;
   a second capacitance network operating to at least partially smooth a voltage of the second DC power source; and
   a third capacitance network operating to at least partially smooth a voltage of the final DC power source.

3. The apparatus of claim 2, wherein a total capacitance of the first capacitance network is substantially greater than a total capacitance of the second capacitance network.

4. The apparatus of claim 2, wherein a magnitude of voltage sag and/or a voltage recovery time of the first DC power source are substantially lower than a magnitude of voltage sag and/or a voltage recovery time of the second DC power source.

5. The apparatus of claim 4, wherein the second capacitance network includes an impedance coupled between the one or more vacuum tube rectification devices and the second capacitance network, such that the impedance increases the magnitude of voltage sag, and/or increases the voltage recovery time, of the second DC power source.

6. The apparatus of claim 1, wherein the combiner circuit operates to output voltage and current from whichever of the first and second DC power sources has a higher magnitude voltage to produce the final DC power source.

7. The apparatus of claim 6, wherein the combiner circuit includes:
   a first diode circuit coupled between the first DC power source and the final DC power source; and
   a second diode circuit coupled between the second DC power source and the final DC power source.

8. The apparatus of claim 1, wherein at least one of the solid state rectifier circuit and the vacuum tube rectifier circuit includes the control circuit for varying, in response to the user input, the one or more parameters of the voltage sag and recovery characteristic of the final DC power source.

9. The apparatus of claim 8, wherein the control circuit includes at least one variable voltage regulator circuit coupled between at least one of the first and second DC power sources and the combiner circuit.

10. The apparatus of claim 9, wherein the control circuit includes a variable voltage regulator circuit coupled between the first DC power source and the combiner circuit, and the variable voltage regulator circuit operates to vary, in response to the user input, a magnitude of the voltage of the first DC power source.

11. The apparatus of claim 10, further comprising:
    an actuator operating to produce an electrical output, in response to the user input, that varies between minimum and maximum electrical properties,
    wherein the variable voltage regulator circuit operates to vary the magnitude of the voltage of the first DC power source between minimum and maximum magnitudes in response to the electrical output from the actuator.

12. The apparatus of claim 11, wherein the combiner circuit operates to output voltage and current from whichever of the first and second DC power sources has a higher magnitude voltage to produce the final DC power source.

13. The apparatus of claim 12, wherein:
    the electrical output of the actuator, either to or toward one of the minimum and maximum electrical properties, causes the voltage regulator circuit to produce the minimum voltage magnitude of the first DC power source; and
    the minimum voltage magnitude of the first DC power source is such that the combiner circuit outputs substantially only the voltage and current from the second DC power source to produce the final DC power source.

14. The apparatus of claim 1, wherein the power amplification circuit includes a first vacuum tube element in a power amplification stage for producing the output signal to the speaker, the first vacuum tube element including a plate terminal coupled to the final DC power source.

15. The apparatus of claim 14, wherein:
    the power amplification circuit further includes an output transformer having at least one primary winding and at least one secondary winding; and
    the plate terminal of the first vacuum tube element is coupled to the final DC power source through the primary winding of the output transformer.

16. The apparatus of claim 14, further comprising an impedance coupled between the final DC power source and a screen terminal of the first vacuum tube element.

17. The apparatus of claim 14, further comprising:
    a voltage regulator circuit coupled between the final DC power source and a secondary DC power source; and
    a rectification filtering capacitance operating to at least partially smooth a voltage of the secondary DC power source, which exhibits a voltage sag and recovery characteristic in response to time-variant current drawn therefrom, wherein:
    the secondary DC power source is coupled to a screen terminal of the first vacuum tube element, and
    the voltage regulator circuit operates, in response to user input, to adjust one or more parameters of the voltage sag and recovery characteristic of the voltage on the screen terminal of the first vacuum tube element.

18. The apparatus of claim 17, further comprising a preamplifier circuit having a second vacuum tube element for producing an audio signal to the power amplifier circuit, the second vacuum tube element including a plate terminal coupled to the secondary DC power source.

19. The apparatus of claim 17, wherein the control circuit and the voltage regulator circuit are electrically and/or mechanically coupled to one another such that the same user input simultaneously effects: (i) the one or more parameters of the voltage sag and recovery characteristic of the final DC power source; and (ii) the one or more parameters of the voltage sag and recovery characteristic of the voltage on the screen terminal of the second vacuum tube element.

* * * * *